United States Patent

Lenzlinger

[15] 3,648,127

[45] Mar. 7, 1972

[54] REACH THROUGH OR PUNCH—THROUGH BREAKDOWN FOR GATE PROTECTION IN MOS DEVICES

[72] Inventor: Martin Lenzlinger, Palo Alto, Calif.

[73] Assignee: Fairchild Camera and Instrument Corporation, Mountain View, Calif.

[22] Filed: Sept. 28, 1970

[21] Appl. No.: 76,057

[52] U.S. Cl. ....................317/235, 317/234

[51] Int. Cl. ....................H01l 11/06

[58] Field of Search....................317/234, 235, 237, 239–241

[56] References Cited

UNITED STATES PATENTS

| | | | |
|---|---|---|---|
| 2,869,055 | 1/1959 | Noyce | 317/235 |
| 3,056,888 | 10/1962 | Atalla | 317/235 X |
| 3,283,221 | 11/1966 | Heiman | 317/235 |
| 3,293,087 | 12/1966 | Porter | 148/175 |
| 3,302,078 | 1/1967 | Skellett | 317/235 |
| 3,366,802 | 1/1968 | Hilbiber | 307/251 |
| 3,405,330 | 10/1968 | Hilbiber | 317/235 |
| 3,560,278 | 2/1971 | Sanera | 148/187 |

*Primary Examiner*—James D. Kallam

*Attorney*—Roger S. Borovoy, Alan MacPherson and Charles L. Botsford

[57] ABSTRACT

The gate dielectric of an MOS device is protected from voltage surges by forming a PN-junction in parallel with the gate between the voltage source and ground, and directly above a region of highly conductive semiconductor material.

5 Claims, 3 Drawing Figures

Patented March 7, 1972 3,648,127

INVENTOR.
MARTIN LENZLINGER
BY Alan H. MacPherson
ATTORNEY

REACH THROUGH OR PUNCH—THROUGH BREAKDOWN FOR GATE PROTECTION IN MOS DEVICES

BACKGROUND OF THE INVENTION

1. Field of the Invention

This invention relates to MOS devices and in particular to a structure which protects the gates of MOS devices from the effects of voltages above a selected value.

2. Description of the Prior Art

In MOS devices, the conductivity of a channel region conducting current from a source to a drain is controlled by applying a voltage to a gate electrode overlying the channel. By varying the voltage on the gate, the resistance of the channel region is controlled thereby modulating or controlling the channel current. One problem with an MOS device is that if the potential on the gate is allowed to become greater than the breakdown potential of the dielectric between the gate and the underlying channel region, a large current will surge through the gate, burning out the insulation underlying the gate and ruining the device.

One technique to protect the gate of such a device from breakdown is to place a normally back-biased PN-junction in parallel with the gate electrode. When the voltage across this junction reaches a given value—beneath the breakdown voltage of the gate insulation—the junction breaks down nondestructively.

The dynamic resistance $R_D$ of the diode formed by such a junction creates a voltage divider with the source resistance $R_S$ of the voltage source. The voltage $V_D$ across $R_D$, and consequently the voltage across the gate dielectric, is equal to the breakdown voltage $V_{BD}$ plus the voltage $V_o$ of the source minus the breakdown voltage times the voltage divider ratio. That is, $$V_D=V_{BD}+(V_o-V_{BD})\times R_D k R_S+R_D)$$

when $$(V_o > V_{BD}).$$

For $V_D$ not to exceed the breakdown voltage of the dielectric even for large values of the source voltage, $R_D$ must be much smaller than $R_S$.

PN-junctions, with junction depths typical for MOS devices, in substrates of typical resistivity, have breakdown voltages equal to or larger than the breakdown voltage of the typical gate dielectric. Manufacturers of MOS integrated circuits often use grounded field plates over the junction to reduce the breakdown voltage of the junction to a value considerably lower than the breakdown voltage of the dielectric. However, the effectiveness of this technique is limited by the high dynamic resistance $R_D$ of such a PN-junction.

One proposal to reduce the dynamic resistance of the device in breakdown was made by R. R. Iyer in Volume 56 of "Proceedings of the IEEE" at page 1223 (1968). Iyer proposed use of lateral punch-through devices for gate protection. Iyer formed two PN-junctions closely adjacent to each other, one being connected to the substrate, the other to the gate to be protected. For a given voltage applied to the gate, the depletion region of one PN-junction reaches the depletion region of the other, initiating punch-through breakdown, thereby limiting the back voltage which can be applied to the gate. Iyer thus effectively reduced the dynamic resistance on breakdown of the gate. However, this technique as well as the one using grounded field plates, uses large amounts of chip area for the gate protection device.

SUMMARY OF THE INVENTION

This invention also significantly reduces the dynamic resistance of the device in breakdown. However, this invention does this with a minimum amount of chip area. According to this invention, the gate of an MOS device is protected from voltage surges by forming a PN-junction in parallel with the gate between the voltage source and ground, and directly above a region of highly conductive semiconductor material. This region can be of either N or P conductivity type and serves to limit the width of the depletion region associated with a PN-junction. As the reverse voltage across the junction increases, the electric field across the junction depletion region also increases, causing the PN-junction to break down. One such PN-junction is required for each connection to an MOS integrated circuit.

DETAILED DESCRIPTION

Conductivity types indicated in the following description are for illustrative purposes only. All devices described operate in an analogous manner if all conductivity types and applied voltages are reversed.

Figure 1:
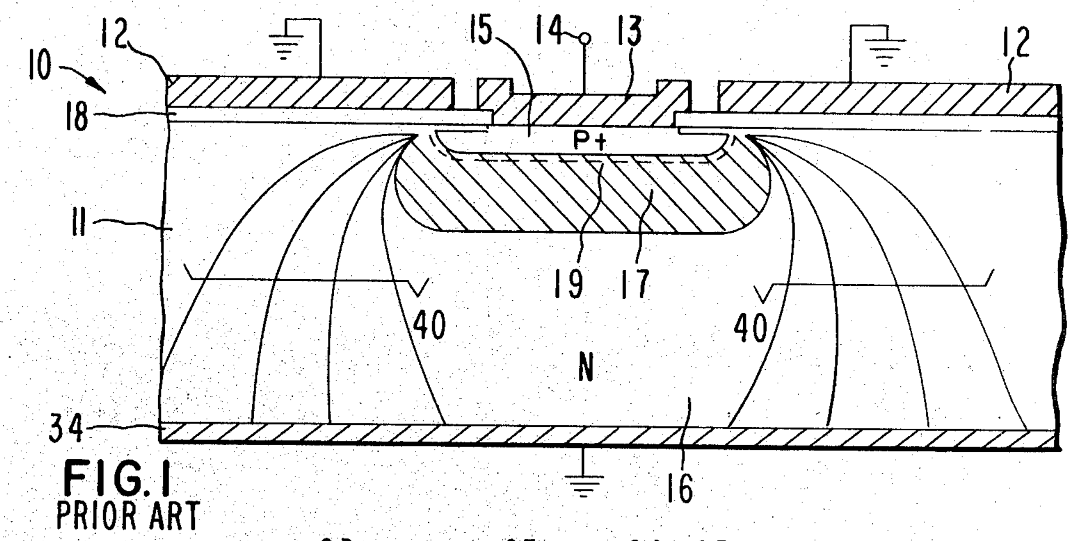
FIG. 1 PRIOR ART
FIG. 1 shows a gate protection arrangement used by the prior art.

FIG. 1 shows a typical structure of the prior art. Semiconductor wafer 10 consists of a substrate of semiconductor material 11 containing thereon a layer of insulation 18. Wafer 10 typically has an MOS transistor therein. Formed in insulation 18 is a window in which is placed contact 13 which is electrically connected with the gate electrode of the transistor. Lead 14 attached to contact 13 allows a selected potential to be applied to contact 13. As shown in FIG. 1, substrate 11 contains a region 16 of N-type conductivity. Directly beneath contact 13 is formed P-type degenerate region 15. A negative potential is applied to lead 14 and region 16 is held at ground potential through contact 34 which is connected directly to ground. Thus the PN-junction 19 between regions 15 and 16 is reverse biased. A depletion region 17, the thickness of which depends on the reverse bias, separates P-type region 15 from N-type region 16.

As an increasingly negative voltage is supplied to contact 13, the reverse voltage across junction 19 increases. Field plates 12 are held at ground potential to shape the electric field in depletion region 17 directly beneath these field plates so that breakdown of junction 19 occurs directly beneath insulation 18. Streamlines 40 indicate the flow of current as the result of breakdown. The current must pass from contact 34 through region 16 and then through the small portion of junction 19 which breaks down. Thus the dynamic resistance of the breakdown path is high due to the large spreading resistance of high-resistivity region 16 and the small area of junction 19 which breaks down.

Figure 2:
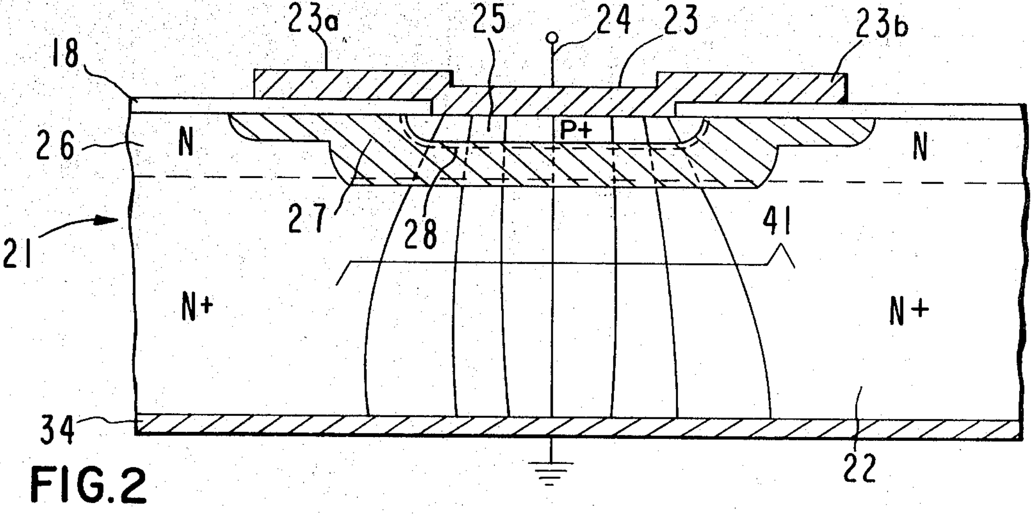
FIGS. 2 and 3 illustrate two alternative structures employing the principles of this invention.

FIG. 2 illustrates one embodiment of the protective structure of this invention. It should be noted that in FIGS. 2 and 3, identical parts of the structures shown therein are numbered identically. The grounded field plates 12 shown in FIG. 1 are omitted from this figure as they are no longer necessary. Contact is made to highly conductive P-type region 25 by contact 23. Lead 24, attached thereto, allows a given potential to be applied to contact 23. As in FIG. 1, depletion region 27 separates N-type region 26 from P-type region 25. However, N-type region 26 is formed on a highly conductive N-type substrate 22. Thus as the negative voltage applied to lead 24 is increased, depletion region 27 gradually extends to the interface between N-type region 26 and N-type region 22. Upon reaching N-type region 22, the depletion region 27 will not extend any further due to the high-impurity concentration of region 22. Any increased negative potential applied to gate 24 increases the reverse voltage across junction 28 and the electric field strength across the depletion region 27. Because of the restricted width of depletion region 27 for a given voltage, the electrical field reaches the critical value required to break down reverse biased junction 28. This breakdown occurs at a voltage lower than the breakdown voltage of the insulation beneath any gate electrodes in parallel with reverse-biased PN-junction 28. In the structure of FIG. 2, the grounded field plates 12 of FIG. 1 have been replaced by extensions 23*a* and 23*b* on insulation 18 of contact 23. Thus junction 28 does not break down in the area directly beneath insulation 18. Rather, breakdown occurs across the entire portion of junction 28 parallel to the boundary between N-type region 22 and N-type region 26. Current flows as shown by streamlines 41 across a broad area of this junction. Because region 22 is highly conductive, its spreading resistance is very low. Also, because breakdown occurs across a broad area of the PN-junction, the dynamic resistance presented to the current flow by this PN-junction is small. Accordingly, the dynamic resistance due to breakdown is significantly reduced over that obtained with prior art protective structures.

Figure 3:
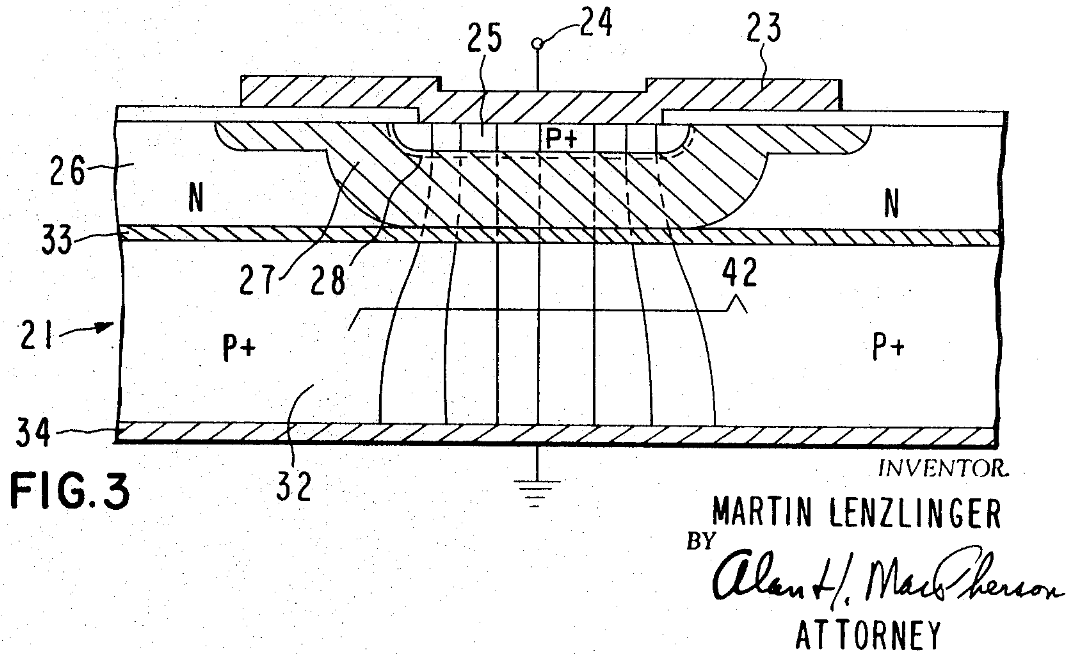

FIG. 3 shows an alternative embodiment of this invention where the highly conductive region of a conductivity type opposite to that of region 25 is replaced by a highly conductive region 32 of the same conductivity type as region 25. As shown in FIG. 3, P-type region 32 is formed first. N-type region 26 is then formed on P-type region 32 thereby creating a depletion region 33 in the vicinity of the PN-junction between regions 32 and 26. Another depletion region 27 separates P-region 25 from N-region 26. Depletion region 27 gradually extends outward from contact 23 in response to an increasingly negative voltage applied to lead 24. For a given negative voltage on lead 24, depletion region 27 contacts depletion region 33 between N-type region 26 and P-type region 32. Upon contacting depletion region 33, breakdown between the P-regions 32 and 25 occurs. P-type region 32 is highly conductive; therefore its spreading resistance is very low. After junction 28 breaks down current flows from contact 34 through to contact 24 with minimal resistance. The large area over which depletion region 27 contacts depletion region 33 insures that PN-junction 28 offers minimal resistance to the flow of current.

The use of vertical reach-through to protect an MOS gate from overload voltages as shown in FIG. 2 or punch-through to a highly doped substrate of the opposite conductivity type as shown in FIG. 3, is achieved with minimum chip area per device. Furthermore, the slight increase in cost of wafer necessitated by the formation of the highly conductive regions 22 or 32 in the wafer is more than offset by the increased yield achieved per wafer due to the smaller portion of wafer surface area consumed per device for gate protection. The techniques of this invention can be used with all MOS circuits that do not require both polarities of gate voltage during normal operation. They can also be used when gate protection is achieved by a resistor in series with the gate, with breakdown occurring to the substrate over the full length of the resistor.

While this invention has been described in terms of a MOS device with a metal gate electrode and oxide for the gate dielectric, this invention can also be used when the gate dielectric comprises a combination of insulating layers rather than just an oxide, and also when the gate electrode is of a selectively doped semiconductor material rather than a metal. The term MOS as used in the claims includes all of these alternative structures.

What is claimed is:

1. A structure containing at least one MOS device, each MOS device possessing a gate separated by insulation from an underlying channel region in a semiconductor substrate and means for protecting said insulation beneath said gate from voltages surges, which comprises:
   - a window formed in said insulation exposing a portion of one surface of said semiconductor substrate, an electrical contact on the surface in said window, said semiconductor substrate comprising:
   - a first region of relatively high conductivity semiconductor material and a second region of relatively low-conductivity semiconductor material, said second region being of one conductivity type and being adjacent and beneath said window; and
   - a region of opposite conductivity type in said second region beneath said window with the PN-junction between said second region and said region of opposite conductivity type extending to said one surface, whereby upon application of a selected potential to said electrical contact the depletion region associated with said PN-junction reaches said underlying relatively high-conductivity region before said PN-junction breaks down.

2. Structure as in claim 1 wherein said first region of relatively high-conductivity semiconductor material is of N-type conductivity, said second region is of N-type conductivity and said region of opposite conductivity type formed in said second region is a region of P-type conductivity.

3. Structure as in claim 1 wherein said first region of relatively high-conductivity semiconductor material is of P-type conductivity, said second region of semiconductor material is of N-type conductivity and said region of opposite conductivity type in said second region is of P-type conductivity.

4. Structure as in claim 1 wherein said first region of relatively high-conductivity semiconductor material is of P-type conductivity, said second region is of P-type conductivity and said region of opposite conductivity type formed in said second region is a region of N-type conductivity.

5. Structure as in claim 1 wherein said first region of relatively high-conductivity semiconductor material is of N-type conductivity, said second region of relatively low-conductivity semiconductor material is of P-type conductivity and said region of opposite conductivity type in said second region is of N-type conductivity.

* * * * *